United States Patent
Cheng et al.

(10) Patent No.: US 9,954,107 B2
(45) Date of Patent: Apr. 24, 2018

(54) STRAINED FINFET SOURCE DRAIN ISOLATION

(71) Applicant: International Business Machines Corporation, Armonk, NY (US)

(72) Inventors: Kangguo Cheng, Schenectady, NY (US); Veeraraghavan S. Basker, Schenectady, NY (US); Theodorus E. Standaert, Clifton Park, NY (US); Junli Wang, Singerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 14/703,953

(22) Filed: May 5, 2015

(65) Prior Publication Data
US 2016/0329429 A1 Nov. 10, 2016

(51) Int. Cl.
*H01L 21/336* (2006.01)
*H01L 29/78* (2006.01)
*H01L 29/66* (2006.01)
*H01L 29/10* (2006.01)

(52) U.S. Cl.
CPC ...... *H01L 29/7851* (2013.01); *H01L 29/1054* (2013.01); *H01L 29/66545* (2013.01); *H01L 29/66795* (2013.01)

(58) Field of Classification Search
CPC ............ H01L 29/66795; H01L 29/785
USPC ............................. 257/401; 438/268
See application file for complete search history.

(56) References Cited

U.S. PATENT DOCUMENTS

| | | | | |
|---|---|---|---|---|
| 6,969,878 B2* | 11/2005 | Coronel | ............ | H01L 29/66772 257/247 |
| 7,193,279 B2* | 3/2007 | Doyle | ............... | H01L 29/66795 257/19 |
| 7,265,418 B2* | 9/2007 | Yun | .................. | H01L 21/823437 257/347 |
| 7,485,520 B2* | 2/2009 | Zhu | .................... | H01L 29/66795 257/E21.301 |
| 7,508,031 B2* | 3/2009 | Liu | ...................... | H01L 27/0207 257/288 |
| 7,592,686 B2* | 9/2009 | Jang | .................. | H01L 21/02532 257/308 |
| 7,622,773 B2* | 11/2009 | Irisawa | ............. | H01L 29/78687 257/347 |

(Continued)

OTHER PUBLICATIONS

Miller, "In Search of Low-k Dielectrics", Science 15 (1999) pp. 421-423.*

*Primary Examiner* — Jay C Kim
(74) *Attorney, Agent, or Firm* — Matthew C. Zehrer

(57) ABSTRACT

A semiconductor structure, such as a strained FinFETs, includes a strain relief buffer (SRB) layer isolated and separated from a source and a drain by a second spacer simultaneously formed with a first spacer upon the sidewalls of a gate structure. The second spacer limits the source and drain from contacting the SRB layer thereby limiting source drain junction leakage. Further, the second spacer limits source and drain punch through to the SRB layer underneath a channel. An etch partially removes a SRB layer portion 24 within a fin stack. The etch undercuts the source and drain forming a fin void without under cutting the channel. The second spacer is formed by depositing spacer material with the fin void.

6 Claims, 6 Drawing Sheets

(56) References Cited

U.S. PATENT DOCUMENTS

| | | | | |
|---|---|---|---|---|
| 7,629,220 B2 * | | 12/2009 | Orlowski | H01L 29/66818 257/E21.442 |
| 7,728,324 B2 * | | 6/2010 | Tezuka | H01L 21/823807 257/20 |
| 7,767,560 B2 * | | 8/2010 | Jin | B82Y 10/00 257/E21.103 |
| 8,035,199 B2 * | | 10/2011 | Izumida | H01L 29/1054 257/327 |
| 8,048,723 B2 * | | 11/2011 | Chang | H01L 29/7851 257/192 |
| 8,080,820 B2 * | | 12/2011 | Pillarisetty | H01L 29/161 257/14 |
| 8,106,459 B2 * | | 1/2012 | Chang | H01L 21/823412 257/328 |
| 8,237,226 B2 * | | 8/2012 | Okano | H01L 21/324 257/368 |
| 8,242,568 B2 | | 8/2012 | Ikeda | |
| 8,263,462 B2 | | 9/2012 | Hung | |
| 8,264,021 B2 * | | 9/2012 | Lai | H01L 29/41791 257/288 |
| 8,293,616 B2 * | | 10/2012 | Chang | H01L 21/823878 257/E21.564 |
| 8,334,184 B2 * | | 12/2012 | Steigerwald | H01L 21/28123 257/407 |
| 8,362,574 B2 * | | 1/2013 | Kawasaki | H01L 29/66795 257/401 |
| 8,394,690 B2 | | 3/2013 | Ikeda | |
| 8,395,195 B2 * | | 3/2013 | Chang | H01L 29/7853 257/255 |
| 8,440,517 B2 * | | 5/2013 | Lin | H01L 29/66795 257/E21.224 |
| 8,598,003 B2 * | | 12/2013 | Murtthy | 257/E21.431 |
| 8,604,548 B2 * | | 12/2013 | Wang | H01L 21/823821 257/351 |
| 8,610,241 B1 * | | 12/2013 | Hu | H01L 27/0629 257/353 |
| 8,729,607 B2 * | | 5/2014 | Itokawa | H01L 29/7853 257/213 |
| 8,729,627 B2 * | | 5/2014 | Cheng | H01L 21/823807 257/288 |
| 8,729,634 B2 * | | 5/2014 | Shen | H01L 29/66818 257/368 |
| 8,759,943 B2 * | | 6/2014 | Tseng | H01L 29/66795 257/513 |
| 8,779,517 B2 * | | 7/2014 | Lin | H01L 21/823431 257/173 |
| 8,796,093 B1 * | | 8/2014 | Cheng | H01L 29/66545 257/327 |
| 8,815,691 B2 * | | 8/2014 | Colinge | H01L 29/785 257/E29.262 |
| 8,823,060 B1 * | | 9/2014 | Colinge | H01L 29/66795 257/192 |
| 8,866,235 B2 * | | 10/2014 | Wu | H01L 21/823418 257/347 |
| 8,871,615 B2 * | | 10/2014 | Mori | H01L 21/3065 257/192 |
| 8,872,225 B2 * | | 10/2014 | Chu-Kung | H01L 21/823821 257/190 |
| 8,889,497 B2 * | | 11/2014 | Chen | H01L 29/7855 257/347 |
| 8,901,607 B2 * | | 12/2014 | Wang | H01L 29/785 257/192 |
| 8,912,602 B2 * | | 12/2014 | Hsu | H01L 29/66795 257/347 |
| 8,921,191 B2 * | | 12/2014 | Cai | H01L 27/0886 438/300 |
| 8,940,640 B2 * | | 1/2015 | Xiao | H01L 29/7848 257/E21.215 |
| 8,946,027 B2 * | | 2/2015 | Anderson | H01L 29/66545 438/282 |
| 9,006,842 B2 * | | 4/2015 | Colinge | H01L 29/7843 257/401 |
| 9,024,364 B2 * | | 5/2015 | Okano | H01L 29/42392 257/255 |
| 9,093,478 B1 * | | 7/2015 | Cheng | H01L 29/6681 |
| 9,117,791 B2 * | | 8/2015 | Glass | H01L 21/28512 |
| 9,117,905 B2 * | | 8/2015 | Su | H01L 21/02532 |
| 9,136,178 B2 * | | 9/2015 | Li | H01L 21/28123 |
| 9,136,332 B2 * | | 9/2015 | Oxland | H01L 29/0673 |
| 9,147,616 B1 * | | 9/2015 | Jacob | H01L 27/0886 |
| 9,153,692 B2 * | | 10/2015 | Kim | H01L 29/7848 |
| 9,159,824 B2 * | | 10/2015 | Lee | H01L 29/66431 |
| 9,159,831 B2 * | | 10/2015 | Liu | H01L 29/66795 |
| 9,166,022 B2 * | | 10/2015 | Xu | H01L 29/66795 |
| 9,190,417 B2 * | | 11/2015 | Chang | H01L 29/7848 |
| 9,202,917 B2 * | | 12/2015 | Ching | H01L 29/785 |
| 9,214,555 B2 * | | 12/2015 | Oxland | H01L 29/785 |
| 9,224,849 B2 * | | 12/2015 | Colinge | H01L 21/823431 |
| 9,281,378 B2 * | | 3/2016 | Ching | H01L 29/66545 |
| 9,349,837 B2 * | | 5/2016 | Ching | H01L 29/66795 |
| 9,362,362 B2 * | | 6/2016 | Cheng | H01L 29/1083 |
| 9,385,218 B1 * | | 7/2016 | Cheng | H01L 29/66795 |
| 9,450,078 B1 * | | 9/2016 | Tang | H01L 29/66795 |
| 9,502,560 B2 * | | 11/2016 | Zhu | H01L 29/66795 |
| 9,583,621 B2 * | | 2/2017 | Zhu | H01L 21/823431 |
| 9,608,059 B2 * | | 3/2017 | Cappellani | H01L 29/66795 |
| 2002/0011612 A1 * | | 1/2002 | Hieda | H01L 21/823814 257/262 |
| 2007/0221956 A1 * | | 9/2007 | Inaba | H01L 21/823807 257/197 |
| 2008/0006908 A1 * | | 1/2008 | Lin | H01L 29/1054 257/619 |
| 2012/0319211 A1 * | | 12/2012 | van Dal | H01L 29/66795 257/401 |
| 2013/0069128 A1 * | | 3/2013 | Okano | H01L 29/66795 257/288 |
| 2014/0054679 A1 * | | 2/2014 | Tang | H01L 29/785 257/329 |
| 2014/0097487 A1 * | | 4/2014 | Yen | H01L 29/66803 257/327 |
| 2014/0175554 A1 * | | 6/2014 | Loubet | H01L 21/823431 257/368 |
| 2015/0255456 A1 * | | 9/2015 | Jacob | H01L 27/0886 257/401 |
| 2015/0255609 A1 * | | 9/2015 | Zhu | H01L 29/6681 257/401 |
| 2015/0303192 A1 * | | 10/2015 | Zhu | H01L 21/823821 257/401 |
| 2015/0340290 A1 * | | 11/2015 | Zhu | H01L 21/823821 257/401 |
| 2016/0071979 A1 * | | 3/2016 | Jacob | H01L 29/66803 257/401 |
| 2016/0087062 A1 * | | 3/2016 | Yin | H01L 29/4916 257/344 |
| 2016/0190304 A1 * | | 6/2016 | Morin | H01L 29/785 257/347 |

\* cited by examiner

STRAINED FINFET SOURCE DRAIN ISOLATION

FIELD

Embodiments of invention generally relate to semiconductor devices, design structures for designing a semiconductor device, and semiconductor device fabrication methods. More particularly, embodiments relate to strained FinFETs formed on a strain relaxation buffer (SRB) layer with isolated source drain regions.

BACKGROUND

The term FinFET typically refers to a nonplanar, double-gate transistor. Integrated circuits that include FinFETs may be fabricated on a bulk silicon substrate or, more commonly, on a silicon-on-insulator (SOI) wafer that includes an active SOI layer of a single crystal semiconductor, such as silicon, a semiconductor substrate, and a buried insulator layer, e.g., a buried oxide layer that separates and electrically isolates the semiconductor substrate from the SOI layer. Each FinFET generally includes a narrow vertical fin body of single crystal semiconductor material with vertically-projecting sidewalls. A gate contact or electrode intersects a channel region of the fin body and is isolated electrically from the fin body by a thin gate dielectric layer. At opposite ends of the fin body are heavily-doped source/drain regions.

As technology node sizes shrink, it may be beneficial to utilize strained FinFETs. A strained FinFET includes a strained fin body that includes distorted crystal lattices, relative to silicon, which generally improves electron and hole mobility though the strained fin body. The strained fin bodies of strained FinFETs may be fabricated from a strained layer epitaxially grown upon on an SRB layer. Such a technique may be particularly beneficial since epitaxy defects may be confined to the SRB layer, leaving the strained layer substantially defect free. However, challenges exists in the formation and integration of source drain regions in these strained FinFETs.

Particularly, if the source drain regions contact the SRB layer having epitaxy defects, excessive source drain junction leakage may occur. Further, source drain punch through may also occur due to excessive dopant diffusion through the defective SRB layer underneath the channel region. Even further, portions of the strained fin bodies may remained undoped resulting in higher resistance.

SUMMARY

In a first embodiment of the present invention, a semiconductor device fabrication method includes epitaxially growing a SRB layer upon a semiconductor substrate, epitaxially growing a strained channel layer upon the SRB layer, forming a fin stack by removing portions of the SRB layer and the strained channel layer, forming a PTS between a SRB fin portion and a strained channel fin portion, forming a STI layer upon the SRB layer adjacent to the fin stack; forming a dummy gate structure upon the STI layer surrounding the fin stack, removing portions of the STI layer adjacent to the dummy gate structure to expose at least a section of the SRB fin portion, removing the exposed SRB fin portion forming a fin void, and forming a low-k spacer upon the gate structure sidewalls and within the fin void, the low-k spacer within the fin void separates the fin stack from the SRB layer within source and drain regions of the semiconductor device.

In another embodiment of the present invention, a semiconductor device includes a SRB layer upon a semiconductor substrate, a strained channel layer upon the SRB layer, a fin stack comprising a channel layer portion and a PTS, a STI layer upon the SRB layer adjacent to the fin stack, a gate structure upon the STI layer surrounding the channel layer portion of the fin stack, a first low-k spacer upon the gate structure sidewalls, and a second low-k spacer that separates the PTS and the SRB layer within source and drain regions of the semiconductor device.

In yet another embodiment, the semiconductor device is included in a design structure embodied in a machine readable storage medium for designing, manufacturing, or testing an integrated circuit.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments relate to semiconductor structures, such as a strained FinFETs, including a SRB layer with isolated source drain regions. The source drain regions are isolated from the SRB layer by a fin-spacer formed simultaneously with a gate spacer. Therefore, the fin-spacer limits the strained source drain fin body from contacting the SRB thereby limiting source drain junction leakage. Further, the fin-spacer isolates the strained channel fin body from the SRB layer. Therefore, source drain punch through to the defective SRB layer underneath the channel region is limited. Even further, the fin-spacer may allow the strained fin body to be fully doped, resulting in lower resistance.

Referring now to the FIGs., exemplary process steps of forming a structure 10 in accordance with embodiments of the present invention are shown, and will now be described in greater detail below. It should be noted that some of the FIGs depict a cross section view of gate region 2 of structure 10, a cross section view of fin end region 4 of structure 10, and/or a cross section view of fin length region 6 of structure 10. Furthermore, it should be noted that while this description may refer to some components of the structure 10 in the singular tense, more than one component may be depicted throughout the figures and like components are labeled with like numerals. The specific number of components depicted in the figures and the cross section view was chosen for illustrative purposes only.

Figure 1:
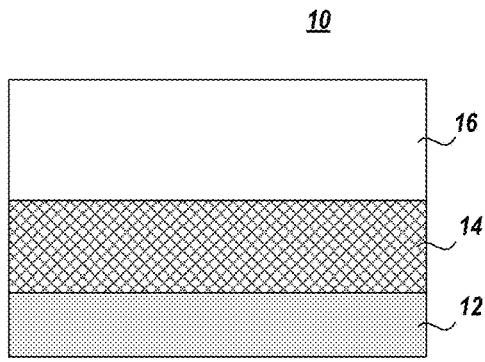
FIG. 1-FIG. 2 depict cross section views of a semiconductor structure at an intermediate stage of semiconductor device fabrication, in accordance with various embodiments of the present invention.

FIG. 1 depicts a cross section views of a semiconductor structure at an intermediate stage of semiconductor device fabrication, in accordance with various embodiments of the present invention. At the present stage of fabrication, SRB layer 14 is formed upon substrate 12 of semiconductor structure 10 and subsequently strained channel layer 16 is formed upon SRB layer 14.

FIG. 1 depicts structure 10 including a strained channel layer 16 above a silicon substrate 12. Due to a lattice constant mismatch between the substrate 12 and the strained channel material 16, the strain relief buffer (SRB) layer 14 is provided between the substrate 12 and the strained channel layer 16. FIG. 1 depicts the situation where a single SRB layer 14 may be formed above the substrate 10. Typically, such a single SRB layer 14 is relatively thick and the lattice constant of the SRB layer 14 would be different at the SRB/substrate interface and the SRB/channel material interface.

The SRB layer 14 is comprised of a set of various materials that are epitaxially grown on top of each other so as to gradually change the lattice constant from the substrate material 12 more towards the lattice constant of the strained channel layer 16, such that the top layer matches the lattice constant of the strained channel layer 16 and is substantially defect-free. The purpose of the SRB layer 14 is to provide a smoother, more gradual transition between the two mismatched materials 12, 16, with the ultimate goal being to produce defect-free channel material 16 with high charge carrier mobility properties.

The structure depicted in FIG. 1 may be formed by epitaxially growing the various material layers on and above the substrate 12. In an alternative process, blanket III-V layers may also be formed on or above the substrate 12 by the use of well-known wafer bonding techniques. Using such techniques, one or more III-V layers are transferred from a donor substrate to a target substrate, similar to well-known SOI fabrication processes. Multiple alternative channel materials may be introduced during the growth or formation of strained channel layer 16 to be suited for use in CMOS applications.

Substrate 12 may preferably be relaxed Si. Typically substrate 12 may be about, but is not limited to, several hundred microns thick. For example, the substrate 12 may have a thickness ranging from 200 nm to about 5 um. The SRB layer 14 may preferably include multiple materials. In P-type regions SRB layer 14 may be SiGe having concentrations of Ge being asymptotic to zero approaching substrate 12 and being asymptotic to Ge concentrations (e.g., 80% atomic Ge) close to strained channel layer 16. In N-type regions SRB layer 14 may be Si having being relaxed approaching substrate 12 and being increasingly strained close to strained channel layer 16. The SRB layer 14 may have a thickness ranging from about 5 nm to about 200 nm. The strained channel layer 16 may preferably include multiple materials. In P-type regions strained channel layer 16 may be SiGe (e.g., 80% atomic Ge). In N-type regions channel layer 16 may be strained Si. The channel layer 16 may have a thickness ranging from about 5 nm to about 200 nm.

Generally, expitaxial growth, grown, deposition, formation, etc. means the growth of a semiconductor material on a deposition or seed surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation.

Examples of various epitaxial growth process apparatuses that are suitable for use in forming epitaxial semiconductor material of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the carbon doped epitaxial semiconductor material typically ranges from 550° C. to 900° C. Although higher temperature typically results in faster deposition, the faster deposition may result in crystal defects, film cracking, etc.

Figure 2:
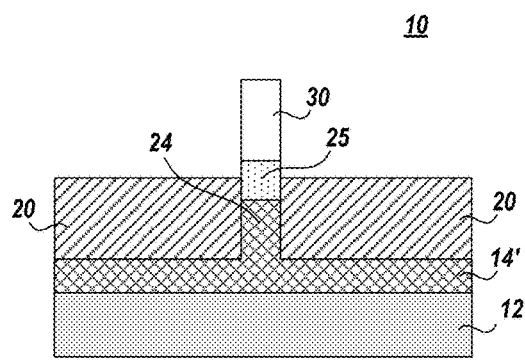

FIG. 2 depict cross section views of a semiconductor structure at an intermediate stage of semiconductor device fabrication, in accordance with various embodiments of the present invention. At the present stage of fabrication, channel layer 16 and SRB layer 14 are recessed and fin 30, punch through stopping region (PTS) 25, and shallow trench isolation (STI) regions 20 are formed.

Channel layer 16 and SRB layer 14 may be removed forming recesses 17 utilizing subtractive etching techniques. Such processes may utilize a mask (not shown) to protect the underlying layer(s) from an etchant utilized to remove non masked sections of the layer(s). The recesses 17 can be formed using process steps such as, without limitation: mask material deposition or formation; photolithography; imaging; etching; and cleaning. For instance, a soft mask or a hard mask can be formed to serve as the mask while non-masked layer(s) material are removed by the etchant. The etchant(s) may be applied to the layers(s) for a period of time to form recesses 17. Channel layer 16 material protected by the mask is retained and forms fin 30. SRB layer 14 that is protected by the mask is retained and forms SRB portion 24 underneath the fin 30. The sidewalls of SRB portion 24 are generally coplanar with the sidewalls of fin 30. Further, the etchant may not fully remove SRB layer 14 material in non-masked regions. Such retained SRB layer 14 material forms SRB portion 14' upon substrate 12. The recessing of channel layer 16 and SRB layer 14 may be performed in a single etching stage (e.g., a single etchant and mask) or may be performed in multiple etching stages (e.g., a mask and etchant associated with the recessing of channel layer 16 and another mask and/or etchant associated with the recessing of SRB layer 14). Known etch processes, such as such as reactive-ion etching (RIE), plasma etching, etc. may be utilized to generally form a fin stack comprising fin 30 and SRB portion 24 that have sidewalls that may be perpendicular to the upper surface of substrate 12, as is shown in FIG. 2, tapered out, or tapered in, etc.

Impurities can be introduced below the fin 30 to provide PTS 25. PTS 25 may be formed by ion implantation or ion diffusion from dopant carrying thin films. P and As dopants may be utilized for pFET regions, while Boron dopants may be utilized for nFET regions. Such PTS 25 formation steps are familiar to those of skill in the art and continue to evolve. Subsequent to the formation of PTS 25, the fin stack may further include the PTS 25 such that sidewalls of the PTS 25 are coplanar with the sidewalls of the SRB portion and the fin 30.

For clarity, as the fin 30 is formed from channel layer 16, fin 30 has similar properties as channel layer 16. Likewise, SRB portion 14' and 24 have similar properties to SRB layer 14. Generally, the fin stack may be formed upon a semiconductor structure 10 by other known processes or techniques without deviating from the spirit of those embodiments herein claimed.

The STI regions 20 may be deposited upon the recessed SRB portion 14' adjacent to the fin stack. For example, STI 20 material, such as polysilicon or another like STI dielectric material such as oxide and/or nitride, may be deposited by chemical vapor deposition, etc. The STI dielectric may optionally be densified after deposition. STI region 20 generally isolates a fin 30 from an adjacent fin (not shown). STI regions 20 may be formed to a thickness such that the top surface of STI regions 20 is above the top surface of SRB portion 24 and below the bottom surface of fin 30. In other words, the STI regions 20 may be formed to a thickness such that the top surface of STI regions is between the top surface of PTS 25 and the bottom surface of PTS 25. Generally, the STI regions 20 may be formed upon a semiconductor structure 10 by other known processes or techniques without deviating from the spirit of those embodiments herein claimed.

Figure 3A:
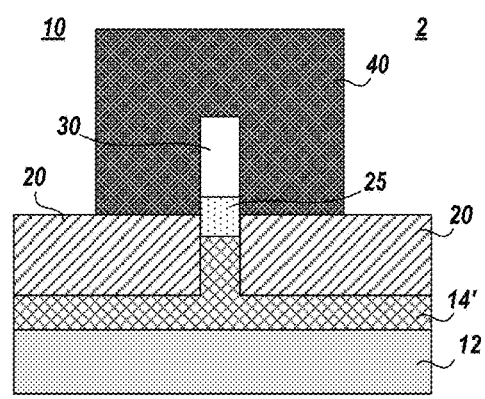
FIG. 3A-FIG. 3B depict cross section views of a semiconductor structure at an intermediate stage of semiconductor device fabrication, in accordance with various embodiments of the present invention.
Figure 3B:
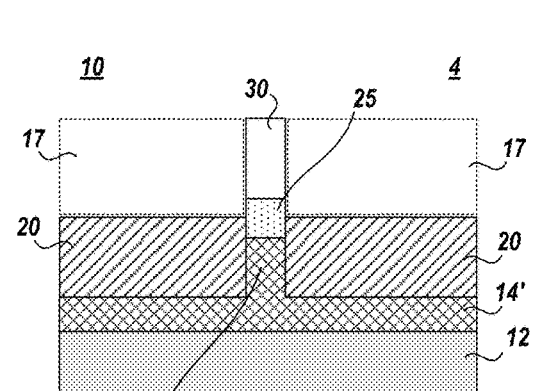

FIG. 3A depicts a gate region 2 fin cross section view of semiconductor structure 10 and FIG. 3B depicts a source drain region 4 fin cross section view of semiconductor structure 10 at an intermediate stage of semiconductor device fabrication, in accordance with various embodiments of the present invention. At the present stage of fabrication, dummy gate 40 is formed upon STI regions 20 in gate region 2.

Technology for forming pFET and nFET devices on finned structures is known and also continues to be developed. The gates of FinFETs can be formed using a "gate-first" process wherein generally a gate stack and spacers are formed prior to selective epitaxial growth on the fins wherein source and drain regions are enlarged. A "gate-last" process may alternatively be employed. Gate-last procedures can involve making a dummy gate, fabricating other elements of the transistor, removing the dummy gate, and replacing the removed dummy gate with actual gate materials. For clarity, though the FIGs. depict a "gate-last" process, structure 10 may be also be formed utilizing "gate-first" processes.

If a gate-first process as described above is employed, the gate structure (not shown) may comprise a gate dielectric (e.g., high-k such as hafnium oxide, etc.), a gate conductor (e.g., metal gate, etc.), a gate cap (e.g., nitride, etc.). Any suitable deposition technique can be used to deposit high-k and metal gate, including but not limited to atomic layer deposition, chemical vapor deposition, physical vapor deposition, sputtering, plating, etc. Gate material can be formed both above and between the fin stack in some embodiments or, alternatively, only between the fin stacks. If a gate-last process is employed, a dummy gate 40 is formed wherein the dummy gate 40 may comprise a dummy gate dielectric (e.g., oxide, etc.) covering fin 30, a dummy gate material (e.g., polysilicon, etc.) on top of the dummy gate dielectric, and a dummy gate cap material (e.g., nitride, etc.) on top of the dummy gate material. The gate cap material may be a remnant of a masking layer utilizing in the subtractive etching processes utilized to form the gate. This dummy gate 40 is removed in a later process familiar to those of skill in the art and a replacement metal gate composition is patterned at an appropriate stage of the transistor fabrication process.

Figure 4A:
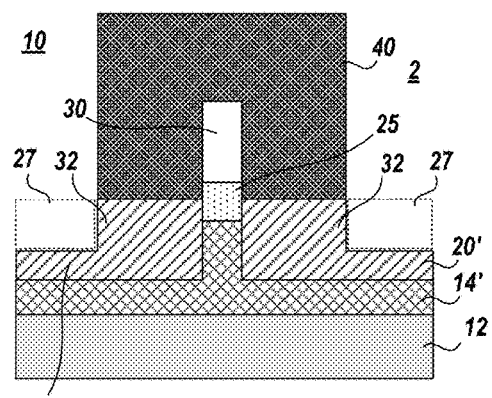
FIG. 4A-FIG. 4B depict cross section views of a semiconductor structure at an intermediate stage of semiconductor device fabrication, in accordance with various embodiments of the present invention.
Figure 4B:
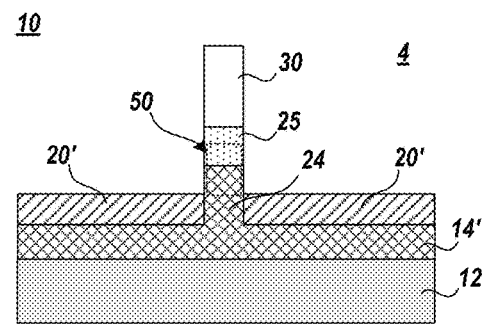

FIG. 4A depicts a gate region 2 fin cross section view of semiconductor structure 10 and FIG. 4B depicts a source drain region 4 fin cross section view of semiconductor structure 10 at an intermediate stage of semiconductor device fabrication, in accordance with various embodiments of the present invention. At the present stage of fabrication, STI regions 20 are recessed adjacent to the gate structure.

Portions of STI regions 20 may be removed forming recesses 27 utilizing subtractive etching techniques. A mask (not shown) to protect the underlying layer(s) from an etchant utilized to remove non masked sections of STI regions 20. The recesses 27 can be formed using process steps such as, without limitation: mask material deposition or formation; photolithography; imaging; etching; and cleaning. For instance, a soft mask or a hard mask can be formed to serve as the mask while non-masked STI region 20 material is removed by the etchant. The etchant(s) may be applied to STI regions 20 for a period of time to form recesses 27. STI region 20 material that is protected by the mask is retained and forms a STI portion 32 underneath the gate structure. The sidewalls of the STI portion 32 are generally coplanar with the sidewalls of the gate structure. Further, the etchant may not fully remove STI region material 20 in non-masked regions. Such retained STI region 20 material forms STI portion 20' upon SRB portion 14'. Known etch processes, such as RIE, plasma etching, etc. may be utilized to generally form recesses 27.

The depth of the recesses 27 are formed such that the upper surface of STI portion 20' is lower than the upper surface of SRB portion 24. Therefore, in source drain regions 4, recesses 27 expose a region 50 of the fin stack. The exposed region 50 of the fins stack includes at least a segment of SRB portion 24 and may also include a segment of PTS 25.

Figure 5A:
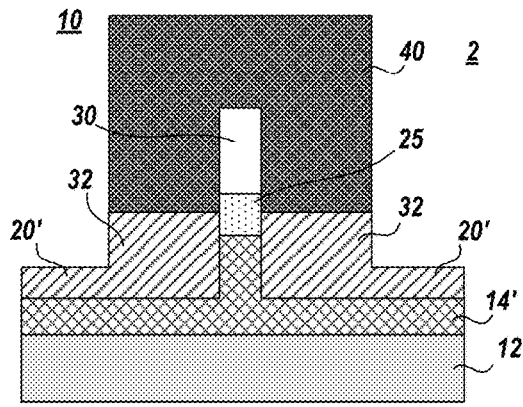
FIG. 5A-FIG. 5B depict cross section views of a semiconductor structure at an intermediate stage of semiconductor device fabrication, in accordance with various embodiments of the present invention.
Figure 5B:
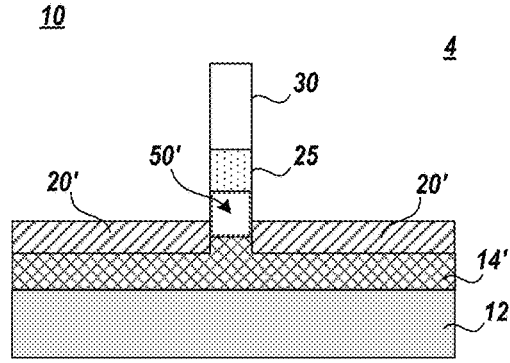

FIG. 5A depicts a gate region 2 fin cross section view of semiconductor structure 10 and FIG. 5B depicts a source drain region 4 fin cross section view of semiconductor structure 10 at an intermediate stage of semiconductor device fabrication, in accordance with various embodiments of the present invention. At the present stage of fabrication, the exposed region 50 is selectively etched in source drain regions 4 to remove the exposed segment of SRB portion 24.

To provide for the selective etching of the exposed segment of SRB portion 24, the exposed segment of SRB portion 24 may be selected so as to have differing etch properties in relation to surrounding materials (e.g., STI portions 20', PTS 25, etc.). It may be desirable that for the selective etching the material of the exposed segment of SRB portion 24 etches at a faster rate than its surrounding materials. Such requirements may be satisfied in embodiments of the invention by several different combinations of material selections. For example, the exposed segment of SRB portion 24 may be SiGe, the STI portions 20' may be $SiO_2$, and the PTS 25 may be doped Si or doped SiGe. A high selectivity, e.g., greater than 5:1, can be achieved by etching SRB portion 24 selective to STI portions 20' and PTS 25. Thus, the exposed segment of SRB portion 24 may be removed whilst its surrounding materials may generally be retained. For instance, the fin stack may be 10 nm wide and a small etch (e.g., 5 nm etch) may be sufficient to remove the exposed segment of SRB portion 24. A void 50' of the removed SRB segment material may be slightly greater than the volume of the exposed segment of the SRB portion 24. In other words, the void 50' of removed SRB portion 24 may include SRB portion 24 material below the upper surface of STI regions 20. Generally, the exposed segment of SRB portion 24 may be removed forming void 50' by other known processes or techniques without deviating from the spirit of those embodiments herein claimed.

Figure 6A:
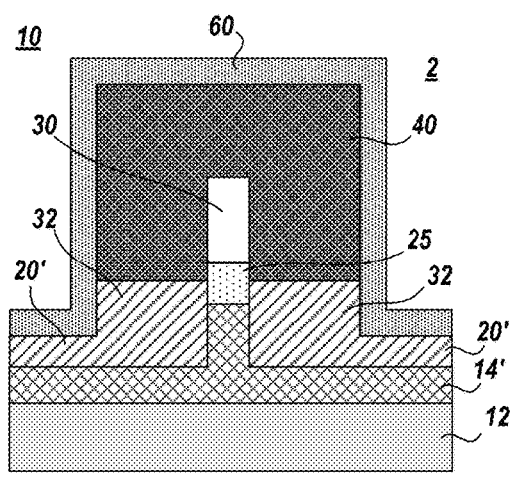
FIG. 6A-FIG. 6B depict cross section views of a semiconductor structure at an intermediate stage of semiconductor device fabrication, in accordance with various embodiments of the present invention.
Figure 6B:
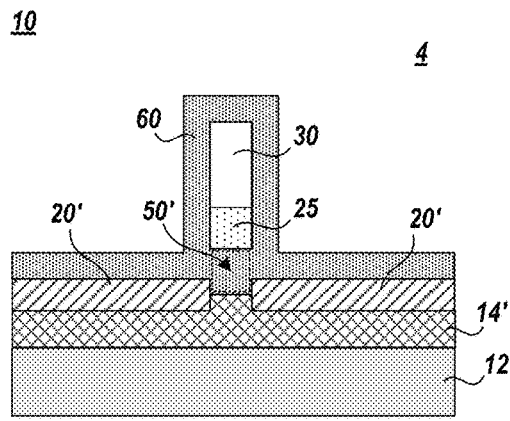

FIG. 6A depicts a gate region 2 fin cross section view of semiconductor structure 10 and FIG. 6B depicts a source drain region 4 fin cross section view of semiconductor structure 10 at an intermediate stage of semiconductor device fabrication, in accordance with various embodiments of the present invention. At the present stage of fabrication, low-k spacer 60 material is deposited upon structure 10.

The low-k spacer 60 material may be deposited as a blanket layer upon structure 10. For example, low-k spacer 60 material may be formed upon the STI portion 20' upper surface, the STI portion 32 sidewall, and the sidewalls and upper surface of dummy gate 40 in gate regions 2 and formed upon the STI portion 20' upper surface, within void 50', and upon the fin stack sidewalls and upper surface in source drain regions 4. Low-k material is a material with a small dielectric constant relative to silicon dioxide. A non-exhaustive list of low k materials are SiBCN, SiOCN, etc.

Low-k spacer 60 can be formed in a conventional manner using well known process techniques (e.g. Rapid Thermal Oxidation, Rapid Thermal Nitridization, etc.). Portions of the low-k material may be removed in subsequent fabrication stages and portions of the low-k material may be retained. Those retained portions of low-k spacer 60 material may be located around the gate structure upon the sidewalls of the gate structure and the low-k spacer 60 material within void 50'. Typically low-k spacer 60 material may be about, but is not limited to, several hundred microns thick. For example, the low-k spacer 60 material may be blanket deposited to a general thickness ranging from 0.5 nm to about 20 nm. Generally, Low-k spacer 60 may be formed upon a semiconductor structure 10 by other known processes or techniques without deviating from the spirit of those embodiments herein claimed.

Figure 7A:
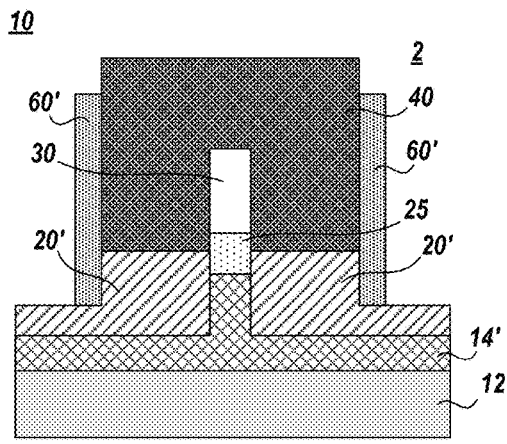
FIG. 7A-FIG. 7B depict cross section views of a semiconductor structure at an intermediate stage of semiconductor device fabrication, in accordance with various embodiments of the present invention.
Figure 7B:
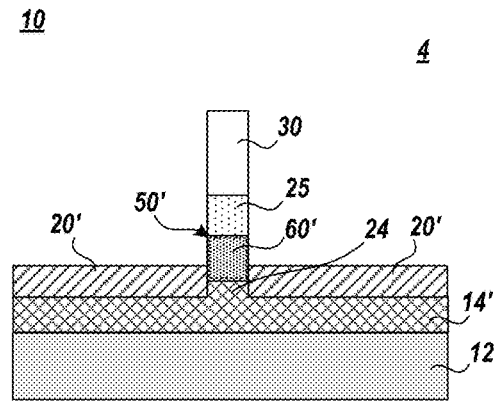

FIG. 7A depicts a gate region 2 fin cross section view of semiconductor structure 10 and FIG. 7B depicts a source drain region 4 fin cross section view of semiconductor structure 10 at an intermediate stage of semiconductor device fabrication, in accordance with various embodiments of the present invention. At the present stage of fabrication, portions of low-k spacer 60 material is removed and other portions of the low-k material may be retained to form low-k spacers 60'. Those retained portions of low-k spacer 60 material may be located upon the sidewalls of the gate structure and the low-k spacer 60 material within void 50'. Since the low-k spacer 60' is formed from the low-k spacer 60 material, low-k spacer 60 has similar properties relative thereto. The low-k spacer 60' under fin 30 isolates the source drain of the strained FinFET from the SRB portion 14' and SRB portion 24. As such, the low-k spacer 60' prevents excessive source drain junction leakage and prevents excessive punch through to SRB portion(s) 24, 14'.

Portions of low-k spacer 60 material may be removed utilizing subtractive etching techniques. A mask (not shown) to protect the intended retained portions of low-k spacer 60 material from an etchant utilized to remove non masked sections low-k spacer 60 material. The removal of low-k spacer 60 material may be completed using process steps such as, without limitation: mask material deposition or formation; photolithography; imaging; etching; and cleaning. For instance, a soft mask or a hard mask can be formed to serve as the mask while non-masked low-k spacer 60 material is removed by the etchant. Low-k spacer 60 material that is protected by the mask is retained and forms low-k spacer 60' adjacent and upon the sidewalls of the gate structure and upon the sidewalls of the STI portion 32 and generally within void 50' underneath fin 30 between PTS 25 and SRB portion 24. Known etch processes, such as RIE, plasma etching, etc. may be utilized to generally form low-k spacer 60' from the low-k spacer material 60.

The subtractive etch that partially removes the low-k layer 60 may be self-aligned to the dummy gate structure 40 and removes the SRB portion 24 exposed in region 50, thereby undercutting the source and drain of the fin stack without under cutting the channel of the fin stack that is protected by the dummy gate structure 40. Generally, low-k spacer 60' may be formed upon a semiconductor structure 10 by other known processes or techniques without deviating from the spirit of those embodiments herein claimed.

Figure 8A:
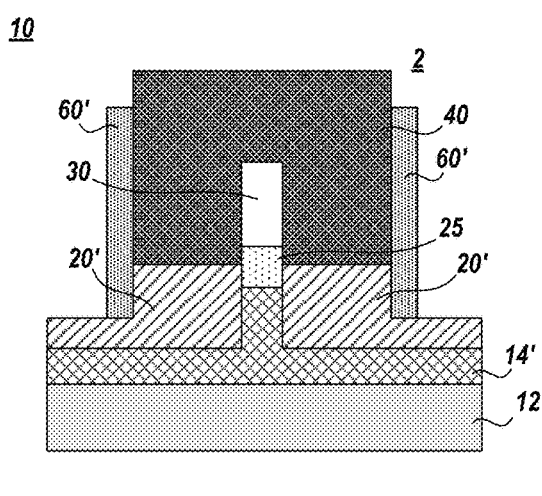
FIG. 8A-FIG. 8B depict cross section views of a semiconductor structure at an intermediate stage of semiconductor device fabrication, in accordance with various embodiments of the present invention.
Figure 8B:
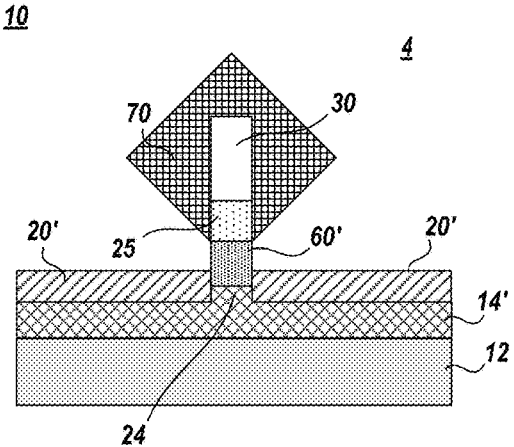

FIG. 8A depicts a gate region 2 fin cross section view of semiconductor structure 10 and FIG. 8B depicts a source drain region 4 fin cross section view of semiconductor structure 10 at an intermediate stage of semiconductor device fabrication, in accordance with various embodiments of the present invention. At the present stage of fabrication, the fin 30 in source drain regions 4 are enlarged by epitaxially growing diamond-shaped volumes 70 thereupon.

Diamond-shaped volumes 70 may be formed from fin 30 sidewall and PTS 25 sidewall seed surfaces. The seed surfaces are <110> surfaces and epitaxial growth thereon forms diamond-shaped volumes 70 having a self-limited <111> bound plane. In various embodiments, neighboring diamond-shaped volumes 70 may meet or merge, or alternatively, neighboring diamond-shaped volumes 70 do not meet or merge. Epitaxy growth is generally quickest from <100> planes and is slowest from <111> planes. When epitaxy growth from fin seed surfaces is complete, a self-limited <111> boundary forms and further epitaxial growth from the <111> plane slows. During epitaxial growth, neighboring diamond-shaped volumes 70 may merge. For example, tips of neighboring diamond-shaped volumes 70 may meet to form a <110> plane there between. Further, the upper surface of the merged diamond-shaped volumes 70 form a <100> plane and epitaxy grows relatively quickly therefrom in a generally vertical direction.

The growth of diamond-shaped epitaxy volumes 70 may result in unfilled regions being formed between neighboring fins near the base of the respective fins. Generally, the unfilled region is the absence of epitaxial material grown from the seed surfaces.

In the fabrication of an exemplary pFET structure, boron-doped SiGe can be employed in one or more embodiments for the epitaxial growth of volumes 70 on the seed surfaces of the fins. To fabricate nFET structures, volumes 70 are formed with phosphorus-doped silicon (Si:P) in some embodiments. The doping can be chosen as desired for particular transistor applications.

Figure 9A:
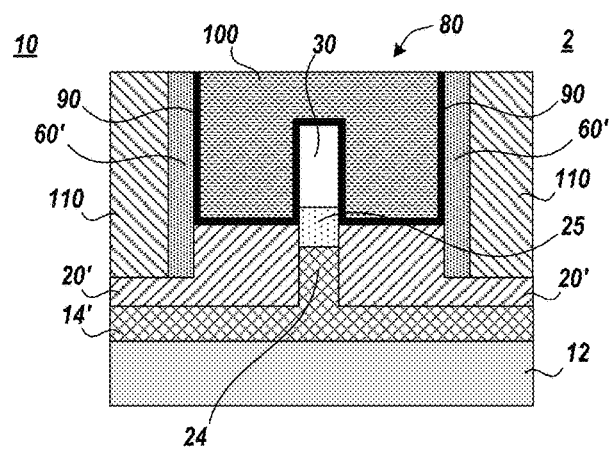
FIG. 9A-FIG. 9C depict cross section views of a semiconductor structure at an intermediate stage of semiconductor device fabrication, in accordance with various embodiments of the present invention.
Figure 9B:
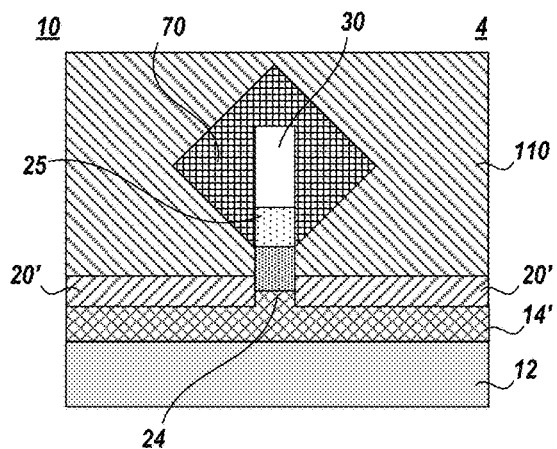
Figure 9C:
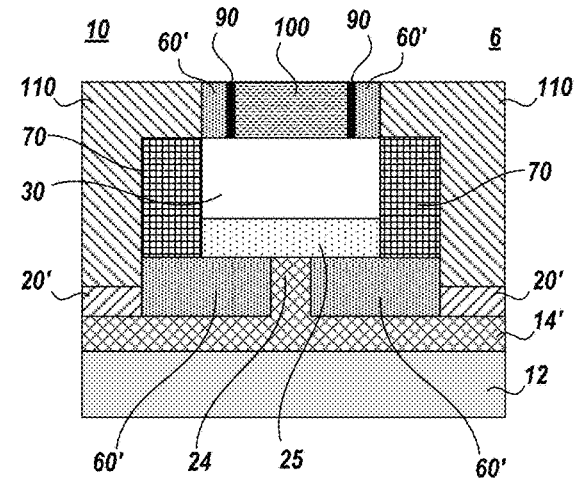

FIG. 9A depicts a gate region 2 fin cross section view of semiconductor structure 10, FIG. 9B depicts a source drain region 4 fin cross section view of semiconductor structure 10, and FIG. 9C depicts a gate and source drain region 6 gate cross section view of semiconductor structure 10 at an intermediate stage of semiconductor device fabrication, in accordance with various embodiments of the present invention. At the present stage of fabrication, inter layer dielectric (ILD) 110 is deposited upon structure 10, dummy gate structure 40 is removed, and a replacement gate structure 100 is formed.

ILD 110 is a dielectric material and is formed by conventional deposition process including, for example, chemical vapor deposition, plasma enhanced chemical vapor deposition or chemical solution deposition to a thickness to cover the gate structure (i.e., an upper surface of ILD 110 is above the upper surface of the gate structure) or to be coplanar with the gate structure (i.e., upper surface of ILD 110 is coplanar with the upper surface of the gate structure, etc.). If ILD 110 is formed to cover gate structure, a subsequent chemical mechanical polish (CMP) stage may remove excess material(s). In various embodiments of the present invention, the materials of ILD 110 or the material of spacer 60' and material of sacrificial gate 40 are chosen to provide for subsequent selective removal of sacrificial gate 40 relative to ILD 110 or the spacer 60'. Such requirement may be satisfied by different combinations of material selections, e.g. SiO2 based ILDs can be used if amorphous or poly-Si is the sacrificial gate 40 material. Unless otherwise indicated, ILD 110 may be formed by other known processes without deviating from the spirted of those embodiments herein claimed.

At this stage of fabrication a FinFET channel region is exposed by removing the dummy gate structure 40. The removal of dummy gate structure 40 may be completed by subtractive etching processes that selectively remove the sacrificial gate stack while other structure 10 materials remain (e.g., ILD 110, spacers 60', fins 30, PTS 25, and STI portion 32, etc.). Such processes may utilize a mask (not shown) to protect regions outside of the dummy gate structure footprint. For instance, a soft mask or a hard mask can be formed overlying the area(s) of ILD 110 and spacers 60' to serve as the mask while the non-masked dummy gate structure 40 is removed by the etchant. The etchant(s) may be chosen to selectively remove the material of the dummy gate structure 40 (e.g. dummy gate material, dummy gate dielectric, dummy gate cap, etc.). The removed dummy gate structure 40 forms a gate trench 80. Unless otherwise indicated, the dummy gate structure 40 may be removed by other known processes without deviating from the spirted of those embodiments herein claimed.

Subsequent to the removal of dummy gate structure 40, a high-k dielectric material layer 90 is deposited with conventional deposition process including, for example, chemical vapor deposition, plasma enhanced chemical vapor deposition or chemical solution deposition. within the gate trench 80. High-k dielectric refers to a material with a high dielectric constant k, as compared to silicon dioxide. Such materials are known in the art. High-k layer 90 may preferably be $HfO_2$, HfZrOx, HfAlOx, $ZrO_2$, HfLaOx, $La_2O_3$, etc. Typically high-k layer 90 may be about, but is not limited to, several hundred microns thick. For example, the high-k layer 90 may have a thickness ranging from 1 nm to about 2 nm. High-k layer 90 may be formed within gate trench 80 upon sidewalls of low-k spacer 60', upon STI portions 32, and upon the fin stack.

A replacement gate structure 100 is formed upon structure 10 upon the high-k layer 90 within the gate trench 80. The gate structure 100 may comprise a gate dielectric (e.g., the high-k material 90, etc.), a gate conductor (e.g., metal gate, etc.), a gate cap (e.g., nitride, etc.). Any suitable deposition technique can be used to deposit high-k and metal gate, including but not limited to atomic layer deposition, chemical vapor deposition, physical vapor deposition, sputtering, plating, etc.

As shown in FIG. 9C, the low-k spacer 60' physically separates the source drain diamond-shaped volumes 70 from the SRB portions 14' and prevents junction leakage and punch through. Further the low-k spacer 60' allows for the fin stack to be fully doped (e.g., the fin stack from the upper surface of low-k spacer 60' to the upper surface of fin 30 may be doped as opposed to portions of the fin stack being dope), reducing resistance. For clarity, structure 10 may undergo further fabrication steps that may add or remove layers, materials, etc. in further front end of line, middle end of line, or back end of line fabrication steps to form a semiconductor device.

Figure 10:
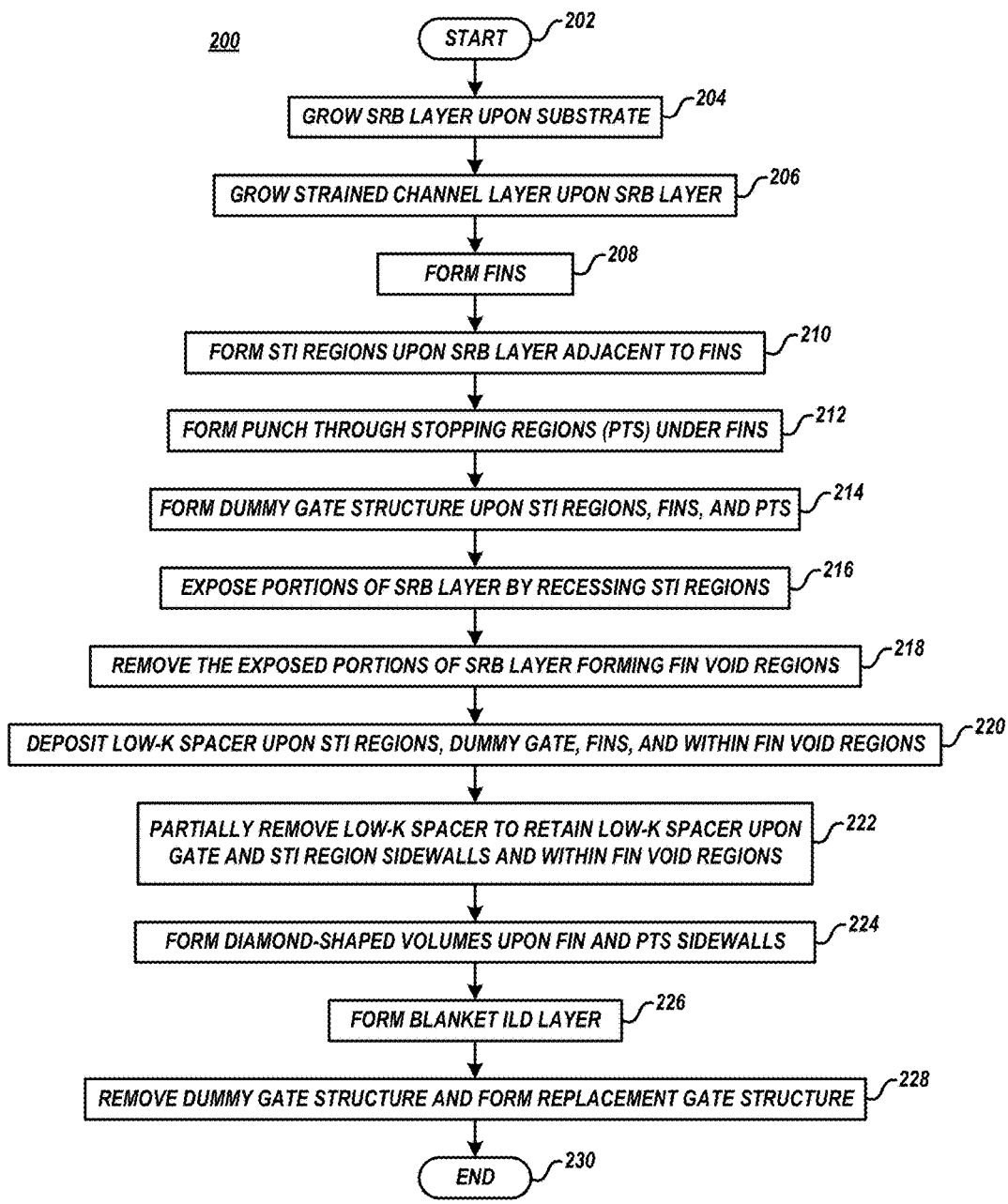
FIG. 10 depicts an exemplary semiconductor device fabrication process flow, in accordance with various embodiments of the present invention.

FIG. 10 depicts an exemplary method 200 for fabricating a semiconductor device, in accordance with various embodiments of the present invention. Method 200 may be utilized to fabricate a semiconductor device (e.g., wafer, chip, integrated circuit, etc.) including a strained FinFET that includes a SRB layer 14' with isolated source and drain (e.g. diamond-shaped volumes 70, etc.). The source and drain are isolated from the SRB layer 14' by a low-k fin spacer 60' formed between fin 30 and SRB layer 14' formed simultaneously with gate low-k spacer 60' located upon sidewalls of a gate structure. Therefore, the fin low-k spacer limits the source and drain from contacting the SRB layer 14' thereby limiting source drain junction leakage. Further, the fin low-k spacer isolates portions of the channel nearest to the source and drain from the SRB layer 14'. Therefore, source drain punch through to the defective SRB layer 14' underneath the channel is limited. Even further, the fin low-k spacer may allow the fin to be fully doped, resulting in lower resistance.

Method 200 begins at block 200 and continues with epitaxially growing an SRB layer 14 upon a semiconductor substrate 12 (block 204) and epitaxially growing a strained channel layer 16 upon the SRB layer 14 (block 206).

Method 200 may continue by forming a fin stack by removing portions of the strained channel layer 16 and portions of the SRB layer 14 (block 208). In some embodiments the fin stack includes a fin 30 and a portion 24 of the SRB layer 14. In other embodiments, the fin stack further includes PTS 25 between the fin 30 and the SRB portion 24 (block 212). The SRB layer 14 material that is retained is herein referred to as SRB portion 24 within the fin stack and SRB portion 14' retained upon the substrate 12. Method 200 may continue by forming STI regions 20 upon the SRB portion 14' and upon and adjacent to the fin stack sidewalls (block 210).

Method 200 may continue with forming dummy gate structure 40 upon STI regions 20 and upon and surrounding the fin stack (block 214). For example, a dummy gate dielectric may be formed upon the STI regions 20 and upon and surrounding the fin stack, dummy gate material may be formed upon the dummy gate dielectric, and a dummy gate cap may be formed upon the dummy gate. Method 200 may continue with recessing STI regions 20 adjacent to the dummy fin structure 40 (block 216). The retained STI region 20 material is herein referred to as STI portion 32 generally below the dummy gate structure 40 and STI portion 20' upon the SRB portion 14'. The recessing of STI regions 20 exposes an exposed region 50 of the fin stack whereby the exposed region 50 includes at least an exposed SRB portion 24 within the fin stack.

Method 200 may continue with removing the exposed SRB portion 24 within region 50 forming fin void region 50' (block 218). For example, a subtractive etching processes (e.g., RIE, etc.) may remove the exposed SRB portion 24. Method 200 may continue with depositing a low-k layer 60 upon STI regions 20', 32, upon the gate structure, upon the fin stack, and within fin void region 50' (block 220). Method 200 may continue with partially removing the low-k layer 60 while retaining low-k spacer 60' upon the gate structure sidewalls and retaining the low-k spacer 60' within fin void region 50' (block 222). The low-k spacer 60' upon the gate structure sidewalls may be herein referred to as the gate low-k spacer and the low-k spacer 60' within the fin void region 50' may be herein referred to as the fin low-k spacer. The subtractive etch that partially removes the low-k layer 60 may be self-aligned to the dummy gate structure 40 and removes the SRB portion 24 exposed in region 50, thereby undercutting the source and drain of the fin stack without under cutting the channel of the fin stack that is protected by the dummy gate structure 40.

Method 200 may continue with epitaxially growing diamond-shaped volumes 70 upon the fin stack sidewalls (block 224). For example, volumes 70 may be grown from fin 30 and PTS 25 sidewall seed surfaces. The volumes 70 extending from either side of the gate structure may form the source and drain of the strained FinFET device. Method 200 may continue with forming an ILD layer 110 upon STI regions 20' surrounding the diamond shaped volumes and adjacent to the gate low-k spacers 60' (block 226).

Method 200 may continue with forming a replacement gate structure 100 in place of the dummy gate structure 40 (block 228). For example, the dummy gate structure 40 may be remove by a subtractive etching process to form a channel trench 80. A high-k layer 90 may be deposited within the channel trench 80 and a replacement gate 100 may be deposited upon the high-k layer 90, a replacement gate cap may be formed upon the replacement gate 100. Method 200 ends at block 230.

Figure 11:
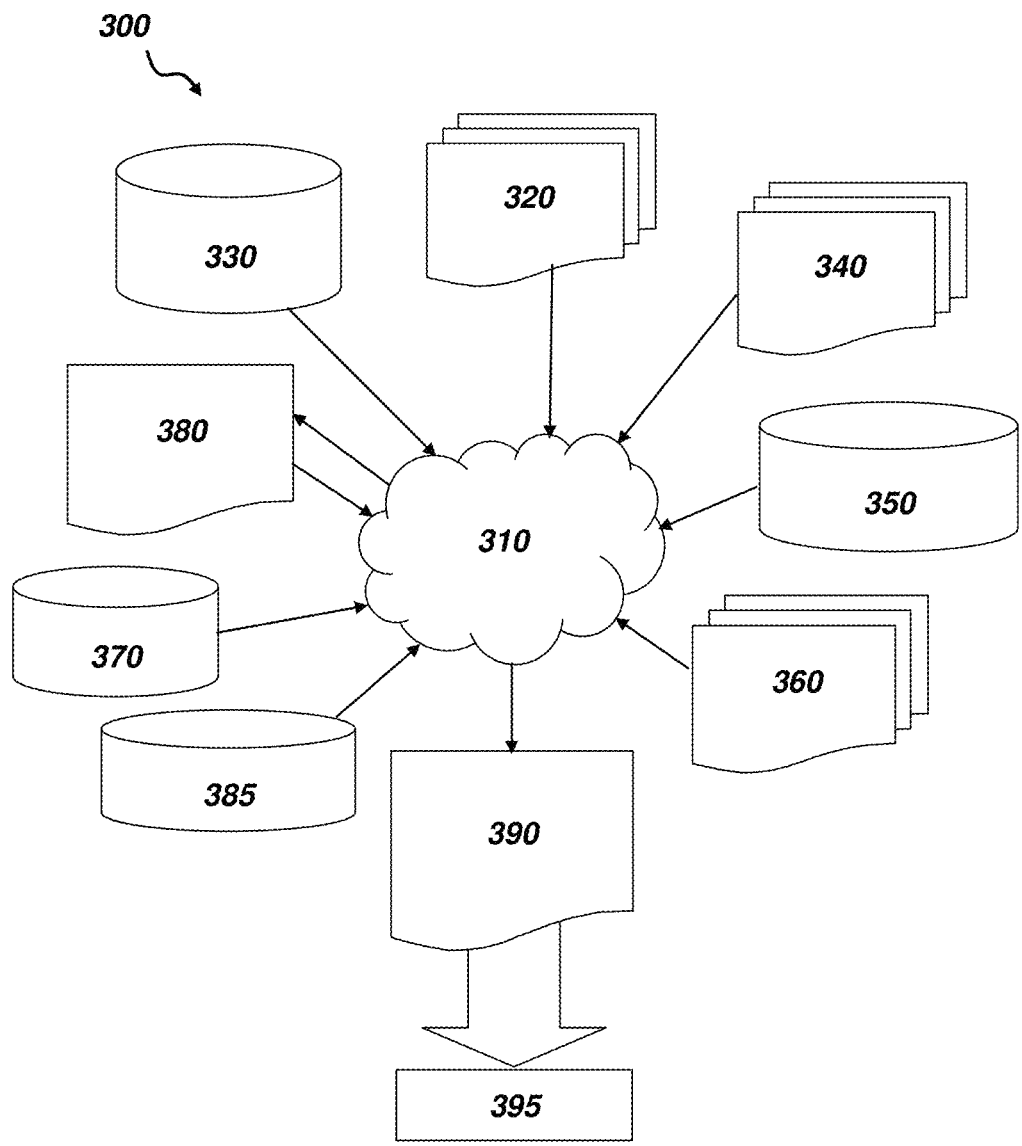
FIG. 11 depicts a flow diagram of a design process used in semiconductor design, manufacture, and/or test, in accordance with various embodiments of the present invention.

Referring now to FIG. 11, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 1-9C.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 1-9C. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 1-9C to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9C. In one embodiment, design structure 390 may comprise a compiled, executable HDL simulation model that functionally simulates the devices shown in FIGS. 1-9C.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9C. Design structure 390 may then proceed to a stage 395 where, for example, design structure 390: proceeds to tape-out, is released to manufacturing, is released to a mask house, is sent to another design house, is sent back to the customer, etc.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above may be used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

The invention claimed is:

1. A semiconductor device fabrication method comprising:
    epitaxially growing a Silicon Germanium (SiGe) strain relief buffer (SRB) layer upon a Silicon semiconductor substrate;
    epitaxially growing a SiGe channel layer upon the SRB layer, wherein the SRB layer comprises a material having a lattice constant that is asymptotic to a lattice constant of the semiconductor substrate nearest the semiconductor substrate changing to a lattice constant that is asymptotic to a lattice constant of the channel layer nearest the channel layer;
    removing portions of the SRB layer and portions of the channel layer to form a SRB layer portion upon the semiconductor substrate, to form a SRB fin portion integral to the SRB layer portion, and to form a fin upon the SRB fin portion aligned with the SRB fin portion;
    forming a punch through stop (PTS) between the SRB fin portion and a top section of the fin by doping a lower section of the fin;
    forming a shallow trench isolation (STI) layer upon respective upper surfaces of the SRB layer portion adjacent to the SRB fin portion and adjacent to the PTS;
    forming a gate structure upon the STI layer around the PTS and the fin;
    removing portions of the STI layer adjacent to the gate structure to form first STI portions upon the SRB layer portion adjacent to the gate structure and to form second STI portions under the gate structure, the removing portions of the STI layer exposing a segment of the SRB fin portion within a source region and a drain region (source and drain regions);
    removing a portion of the SRB fin portion from a bottom surface of the PTS to a level below a top surface of the first STI portions forming a fin void;
    forming a low-k spacer upon the gate structure sidewalls, upon the sidewalls of the second STI portions, and within the fin void by forming a low-k layer upon the gate structure sidewalls, upon the sidewalls of the second STI portions, upon the first STI portions, upon the PTS sidewalls, around the fin, and within the fin void, and subsequently removing portions of the low-k layer from the first STI portions, removing the low-k layer from the PTS sidewalls, and removing the low-k layer from the fin sidewalls and upper surface; and
    epitaxially growing diamond-shaped volumes on the sidewalls of the fin within the source and drain regions.

2. The fabrication method of claim 1, wherein the low-k spacer within the fin void limits source drain junction leakage.

3. The fabrication method of claim 1, wherein the low-k spacer within the fin void limits source drain punch through to at least the SRB layer portion.

4. The fabrication method of claim 1, further comprising:
    removing the gate structure between the low-k spacer to form a replacement gate trench;
    forming a high-k layer within the replacement gate trench by forming the high-k layer upon the low-k spacer, upon the second STI portions, upon the sidewalls of PTS, and upon the fin, and;
    forming a replacement gate upon the high-k layer.

5. The fabrication method of claim 1, further comprising:
    forming an interlayer dielectric (ILD) layer upon the first STI portions surrounding the diamond-shaped volumes.

6. The fabrication method of claim 1, wherein the low-k spacer is formed by a material having a dielectric constant less than any dielectric constant of silicon dioxide.

* * * * *